United States Patent
Aga et al.

(10) Patent No.: US 10,115,580 B2
(45) Date of Patent: Oct. 30, 2018

(54) METHOD FOR MANUFACTURING AN SOI WAFER

(71) Applicant: SHIN-ETSU HANDOTAI CO., LTD., Tokyo (JP)

(72) Inventors: Hiroji Aga, Takasaki (JP); Susumu Kuwabara, Annaka (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 15/508,237

(22) PCT Filed: Aug. 28, 2015

(86) PCT No.: PCT/JP2015/004358
§ 371 (c)(1),
(2) Date: Mar. 2, 2017

(87) PCT Pub. No.: WO2016/047047
PCT Pub. Date: Mar. 31, 2016

(65) Prior Publication Data
US 2017/0287697 A1    Oct. 5, 2017

(30) Foreign Application Priority Data
Sep. 24, 2014 (JP) .................... 2014-194425

(51) Int. Cl.
*H01L 21/00* (2006.01)
*H01L 21/02* (2006.01)
(Continued)

(52) U.S. Cl.
CPC .. *H01L 21/02032* (2013.01); *H01L 21/02255* (2013.01); *H01L 21/31111* (2013.01);
(Continued)

(58) Field of Classification Search
CPC ............... H01L 21/02032; H01L 22/20; H01L 21/76254; H01L 21/31111; H01L 21/02255; H01L 21/68764
See application file for complete search history.

(56) References Cited

U.S. PATENT DOCUMENTS

2003/0170990 A1    9/2003  Sakaguchi et al.
2004/0259328 A1*  12/2004  Ito ..................... H01L 22/12
                                                          438/459
(Continued)

FOREIGN PATENT DOCUMENTS

EP    1 480 265 A2    11/2004
JP    2004-253493 A    9/2004
(Continued)

OTHER PUBLICATIONS

Jun. 29, 2017 Office Action issued in Taiwanese Patent Application No. 104128754.
(Continued)

*Primary Examiner* — Mohsen Ahmadi
*Assistant Examiner* — Wasiul Haider
(74) *Attorney, Agent, or Firm* — Oliff PLC

(57) ABSTRACT

A method for manufacturing an SOI wafer having SOI layer includes a thinning step to adjust SOI film thickness of the SOI wafer, including the steps of: (A1) measuring the SOI film thickness of the SOI wafer having the SOI layer before the thinning step; (A2) determining rotational position of the SOI wafer in the thinning step on the basis of a radial SOI film thickness distribution obtained in the measuring of the film thickness and previously determined radial stock removal distribution in the thinning step, and rotating the SOI wafer around the central axis thereof so as to bring the SOI wafer to the determined rotational position; and (A3) thinning the SOI layer of the rotated SOI wafer. The method for manufacturing the SOI wafer can produce an SOI wafer (Continued)

with an excellent radial film thickness uniformity of the SOI layer after the thinning step.

22 Claims, 2 Drawing Sheets

(51) Int. Cl.
  *H01L 21/311* (2006.01)
  *H01L 21/687* (2006.01)
  *H01L 21/762* (2006.01)
  *H01L 21/66* (2006.01)

(52) U.S. Cl.
  CPC .. *H01L 21/68764* (2013.01); *H01L 21/76254* (2013.01); *H01L 22/20* (2013.01)

(56) References Cited

U.S. PATENT DOCUMENTS

| | | |
|---|---|---|
| 2005/0015736 A1 | 1/2005 | Okuno |
| 2005/0218111 A1 | 10/2005 | Maleville et al. |
| 2007/0224778 A1 | 9/2007 | Murakami et al. |
| 2007/0267142 A1 | 11/2007 | Murphy et al. |
| 2008/0305317 A1 | 12/2008 | Ito et al. |
| 2010/0025804 A1 | 2/2010 | Kawai et al. |
| 2010/0129941 A1 | 5/2010 | Okita |
| 2011/0084314 A1* | 4/2011 | Or-Bach ............... G03F 9/7076 257/209 |
| 2013/0102126 A1* | 4/2013 | Aga .................. H01L 21/76254 438/458 |
| 2014/0329372 A1 | 6/2014 | Aga et al. |

FOREIGN PATENT DOCUMENTS

| | | |
|---|---|---|
| JP | 2005-051210 A | 2/2005 |
| JP | 2005-251853 A | 9/2005 |
| JP | 2007-266059 A | 10/2007 |
| JP | 2007-533123 A | 11/2007 |
| JP | 2009-231488 A | 10/2009 |
| JP | 2010-092909 A | 4/2010 |
| JP | 2012-004294 A | 1/2012 |
| TW | 200509187 A | 5/1993 |
| TW | 454346 B | 9/2001 |
| WO | 2013/088636 A1 | 6/2013 |

OTHER PUBLICATIONS

Jun. 29, 2017 Search Report issued in Taiwanese Patent Application No. 104128754.
Nov. 24, 2015 International Search Report issued in International Patent Application No. PCT/JP2015/004358.
Oct. 17, 2017 Office Action issued in Taiwanese Application No. 104128754.
Jan. 5, 2018 Office Action issued in Singapore Application No. 11201701629W.
May 29, 2018 extended European Search Report cited in Application No. 15844654.2.

* cited by examiner

METHOD FOR MANUFACTURING AN SOI WAFER

TECHNICAL FIELD

The present invention relates to a method for manufacturing an SOI wafer, especially to a method for manufacturing an SOI wafer required to have extremely high uniformity of the SOI film thickness called FD-SOI (Fully Depleted Silicon-On-Insulator).

BACKGROUND ART

Previously, as one of the thinning method of SOI layer of an SOI wafer having the SOI layer, it has been performed a process of subjecting an SOI wafer to heat treatment in a batch processing type heat treatment furnace, thereby oxidizing and modifying Si on the SOI layer surface to an oxide film, and then removing this oxide film (so-called sacrificial oxidation process).

For thinning the SOI film thickness precisely to an target value by this method, the thickness of the oxide film have to be accurately controlled so as to be a target value. Actually, however, the oxidation rate changes due to fluctuation of the atmospheric pressure during the oxidation, and it is very difficult to accurately control the oxide film thickness grown by the heat treatment thereby. Accordingly, in film thinning through forming and removing an oxide film, the process has been performed by thinning through forming and removing the oxide film so as to have an SOI film thickness slightly (about 3 nm) thicker than the target value after the thinning step, and thinning by subsequent etching separately performed with the etching time being controlled so as to have the target value.

This two stage thinning process has been performed such that the oxide film after the oxidation is removed, and then the SOI film thickness is measured to set the stock removal in the next stage of the etching stage on the basis of the value, as described in Patent Document 1.

In the two stage thinning process through forming and removing the oxide film together with etching, it has been proposed a method in which the thickness of an SOI layer is measured after the oxidation with the thermal oxide film remaining, and on the basis of the measured film thickness of the SOI layer, the removal of the oxide film, etching, and further cleaning stage are performed in one batch treatment of cleaning to shorten the process.

It has also been proposed a method of controlling the thinning of an SOI layer by using a single wafer processing type etching apparatus in addition to forming and removing of an oxide film and thinning with a batch processing type cleaning machine (Patent Document 2).

When the film thickness of an SOI layer is controlled with high accuracy by these methods, however, radial stock removal variance arises in the thinning step such as forming and removing an oxide film, etching, etc. to degrade the radial film thickness distribution of the SOI layer after the thinning step. It is not possible to meet the needs for the uniformity of the film thickness when highly accurate uniformity of the film thickness is required, for example when all of the points on a wafer surface are required to have a thickness within ±0.5 nm of the target SOI film thickness such as in an FD-SOI wafer.

CITATION LIST

Patent Literature

Patent Document 1: Japanese Unexamined Patent publication (Kokai) No. 2007-266059

Patent Document 2: Japanese Unexamined Patent publication (Kokai) No. 2010-092909

SUMMARY OF INVENTION

Technical Problem

The present invention was accomplished in view of the above-described problems. It is an object of the present invention to provide a method for manufacturing an SOI wafer which can produce an SOI wafer with an excellent radial film thickness uniformity of the SOI layer after the thinning step.

Solution to Problem

To solve the foregoing problems, the present invention provides a method for manufacturing an SOI wafer having an SOI layer including a thinning step to adjust an SOI film thickness of the SOI wafer, comprising the steps of:

(A1) measuring the SOI film thickness of the SOI wafer having the SOI layer before the thinning step;

(A2) determining a rotational position of the SOI wafer in the thinning step on the basis of a radial SOI film thickness distribution obtained in the measuring of the film thickness of the step (A1) and a previously determined radial stock removal distribution in the thinning step, and rotating the SOI wafer around the central axis thereof so as to bring the SOI wafer to the determined rotational position; and (A3) thinning the SOI layer of the SOI wafer rotated in the step (A2).

Such a method for manufacturing an SOI wafer can produce an SOI wafer with an excellent radial film thickness uniformity of the SOI layer after the thinning step to adjust the SOI film thickness.

The present invention also provides a method for manufacturing an SOI wafer having an SOI layer including a thinning step to adjust an SOI film thickness of the SOI wafer, comprising the steps of:

(B0) heat treatment under an oxidizing gas atmosphere to form a thermal oxide film on a surface of the SOI layer;

(B1) measuring the SOI film thickness of the SOI wafer having the thermal oxide film formed in the step (B0) with the thermal oxide film remaining;

(B2) determining a rotational position of the SOI wafer in the thinning step on the basis of a radial SOI film thickness distribution obtained in the measuring of the film thickness of the step (B1) and a previously determined radial stock removal distribution in the thinning step, and rotating the SOI wafer around the central axis thereof so as to bring the SOI wafer to the determined rotational position; and (B3) thinning the SOI layer by batch processing cleaning which includes removing the thermal oxide film on the surface of the SOI layer and etching of the SOI layer of the SOI wafer rotated in the step (B2), with the etching amount of the SOI layer being controlled on the basis of the SOI film thickness obtained in the step (B1).

Such a method for manufacturing an SOI wafer can produce an SOI wafer with an excellent radial film thickness uniformity of the SOI layer after the thinning step by removing the thermal oxide film formed on the surface of the SOI layer before the thinning step to adjust the SOI film thickness, and by etching to adjust the film thickness.

The present invention also provides a method for manufacturing an SOI wafer having an SOI layer including a first thinning step and a second thinning step to adjust an SOI film thickness of the SOI wafer, comprising the steps of:

(C0) heat treatment under an oxidizing gas atmosphere to form a thermal oxide film on a surface of the SOI layer;

(C1) measuring the SOI film thickness of the SOI wafer having the thermal oxide film formed in the step (C0) with the thermal oxide film remaining;

(C2) determining a rotational position of the SOI wafer in the first thinning step on the basis of a radial SOI film thickness distribution obtained in the measuring of the film thickness of the step (C1) and a previously determined radial stock removal distribution in the first thinning step, and rotating the SOI wafer around the central axis thereof so as to bring the SOI wafer to the determined rotational position;

(C3) thinning the SOI layer to be thicker than a final target value of the film thickness as the first thinning step by batch processing cleaning which includes removing the thermal oxide film on the surface of the SOI layer and etching of the SOI layer of the SOI wafer rotated in the step (C2), with the etching amount of the SOI layer being controlled on the basis of the SOI film thickness obtained in the step (C1);

(C4) measuring the SOI film thickness of the SOI wafer after the first thinning step;

(C5) determining a rotational position of the SOI wafer in the second thinning step on the basis of a radial SOI film thickness distribution obtained in the measuring of the film thickness of the step (C4) and a previously determined radial stock removal distribution in the second thinning step, and rotating the SOI wafer around the central axis thereof so as to bring the SOI wafer to the determined rotational position; and (C6) thinning the SOI layer to be the final target value of the film thickness as the second thinning step by cleaning which includes etching of the SOI layer of the SOI wafer rotated in the step (C5), with the etching amount of the SOI layer being controlled on the basis of the SOI film thickness obtained in the step (C4).

Such a method for manufacturing an SOI wafer can produce an SOI wafer with an excellent radial film thickness uniformity of the SOI layer after the thinning step by a two-stage thinning process including the first thinning step to remove the thermal oxide film formed on the surface of the SOI layer before the thinning step to adjust the SOI film thickness, and the second thinning step to adjust the film thickness to the target value by etching.

In this case, the cleaning of the step (C6) is preferably performed by single wafer processing.

The second thinning step performed by single wafer processing makes it possible to produce an SOI wafer while further improving the controllability of the film thickness of the SOI layer after the thinning step.

The rotational position is preferably determined to a position where an area showing the maximum value of the radial SOI film thickness distribution obtained in the measuring of the film thickness corresponds to an area showing the maximum value of the previously determined radial stock removal distribution in the thinning step.

The rotational position is preferably determined to a position where an area showing the minimum value of the radial SOI film thickness distribution obtained in the measuring of the film thickness corresponds to an area showing the minimum value of the previously determined radial stock removal distribution in the thinning step.

The rotational position is preferably determined to a position where a difference between a calculated radial maximum value and a calculated radial minimum value of the SOI film thickness after the thinning step is minimum in calculation of the respective radial SOI film thickness distributions after the thinning step when altering the rotational position by a prescribed angle on the basis of the radial SOI film thickness distribution obtained by the measuring of the film thickness and the previously determined radial stock removal distribution in the thinning step.

By the thinning step with rotating the SOI wafer so as to bring the SOI wafer to the rotational position determined by such criteria, it is possible to produce an SOI wafer with an excellent radial film thickness uniformity of the SOI layer after the thinning step more securely.

It is preferable to perform the step of measuring the SOI film thickness before the thinning step and the subsequent step of rotating the SOI wafer in the same apparatus.

The process can be simplified by performing these steps in one apparatus as described above.

It is also preferable to form the SOI layer by an ion implantation delamination method including at least the steps of:

bonding a bond wafer having a micro bubble layer formed by an ion implantation with a base wafer to be a support substrate, and delaminating the bond wafer along the micro bubble layer as a boundary to form a thin film on the base wafer.

As described above, the ion implantation delamination method can be suitably used for forming the SOI layer in the inventive method for manufacturing an SOI wafer.

The thinning step is preferably performed by immersion in SC1 solution.

As described above, SC1 solution can be suitably used for the thinning step in the inventive method for manufacturing an SOI wafer.

Advantageous Effects of Invention

As described above, the inventive method for manufacturing an SOI wafer can produce an SOI wafer with an excellent radial film thickness uniformity of the SOI layer after the thinning step while controlling the film thickness of the SOI layer with high accuracy, for example, in a method for thinning an SOI layer by removing a thermal oxide film formed on the surface of the SOI layer and a method for thinning an SOI layer by a two-stage thinning process including removal of a thermal oxide film and adjustment of the film thickness. Accordingly, such methods are suitable for forming an FD-SOI wafer, which is required to have extremely high radial film thickness uniformity of the SOI layer. The inventive methods can improve the radial SOI film thickness distribution, and can improve the yield of producing an SOI wafer having a target SOI film thickness. As a result, it is possible to reduce the cost of the process.

DESCRIPTION OF EMBODIMENTS

Figure 1:
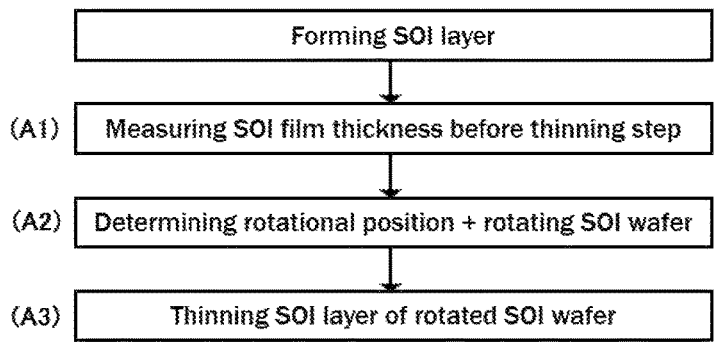
FIG. 1 is a flow diagram showing an example of the inventive method for manufacturing an SOI wafer.

As described above, it has been desired to develop a method for manufacturing an SOI wafer which can produce an SOI wafer with an excellent radial film thickness uniformity of the SOI layer after the thinning step to adjust the SOI film thickness.

The present inventors has diligently studied to accomplish the above-mentioned objects and consequently found that an SOI layer before the thinning step contains deviation in the radial distribution, and a radial stock removal distribution in the thinning step also contains deviation, thereby the radial film thickness uniformity of the SOI layer after the thinning step can degrade when a portion with a thin film thickness of the SOI layer before the thinning step becomes a portion where the stock removal in the thinning step is large, for example. On the basis of this respect, the present inventors also found that the radial film thickness uniformity of the SOI layer after the thinning step can be improved by measuring the SOI film thickness before the thinning step, determining a rotational position of the SOI wafer in the thinning step on the basis of the measured radial SOI film thickness distribution and a previously determined radial stock removal distribution in the thinning step, and performing the thinning step in a state in which the SOI wafer is rotated around the central axis thereof so as to be set to such a rotational position; thereby brought the present invention to completion.

That is, the present invention is a method for manufacturing an SOI wafer having an SOI layer including a thinning step to adjust an SOI film thickness of the SOI wafer, comprising the steps of:

(A1) measuring the SOI film thickness of the SOI wafer having the SOI layer before the thinning step;

(A2) determining a rotational position of the SOI wafer in the thinning step on the basis of a radial SOI film thickness distribution obtained in the measuring of the film thickness of the step (A1) and a previously determined radial stock removal distribution in the thinning step, and rotating the SOI wafer around the central axis thereof so as to bring the SOI wafer to the determined rotational position; and (A3) thinning the SOI layer of the SOI wafer rotated in the step (A2).

Hereinafter, the present invention will be described specifically, but the present invention is not limited thereto.

An example of the inventive method for manufacturing an SOI wafer will be described with reference to the flow diagram of FIG. 1. In the method for manufacturing an SOI wafer of FIG. 1, an SOI layer is formed on a wafer at first, and then the SOI film thickness before the thinning step is measured (FIG. 1 (A1)). Subsequently, a rotational position of the SOI wafer in the thinning step is determined on the basis of a radial SOI film thickness distribution obtained in the measuring of the film thickness of the step (A1) and a previously determined radial stock removal distribution in the thinning step, and the SOI wafer is rotated around the central axis thereof so as to bring the SOI wafer to the determined rotational position (FIG. 1 (A2)). Then, the SOI layer of the SOI wafer rotated in the step (A2) is thinned (FIG. 1 (A3)).

Hereinafter, each step will be described more specifically.

[Forming SOI Layer]

In the present invention, the method for forming an SOI layer is not particularly limited, but the SOI layer is preferably formed by an ion implantation delamination method including a step of bonding a bond wafer having a micro bubble layer formed by an ion implantation with a base wafer to be a support substrate, and a step of delaminating the bond wafer along the micro bubble layer as a boundary to form a thin film on the base wafer, for example. The ion implantation delamination method can give an SOI wafer having an extremely thin SOI layer with relatively small radial film thickness distribution.

[(A1) Measuring SOI Film Thickness Before Thinning Step]

In the step (A1), the SOI film thickness is measured on the SOI wafer having the SOI layer before the thinning step to adjust the SOI film thickness. The measurement of the SOI film thickness before the thinning step is not particularly limited, and can be performed by a known method.

[(A2) Determining Rotational Position of SOI Wafer and Rotating SOI Wafer]

In the step (A2), a rotational position of the SOI wafer in the thinning step is determined on the basis of a radial SOI film thickness distribution obtained in the measuring of the film thickness of the step (A1) and a previously determined radial stock removal distribution in the thinning step, and the SOI wafer is rotated around the central axis thereof so as to bring the SOI wafer to the determined rotational position.

When previously determining the radial stock removal distribution in the thinning step to adjust the SOI film thickness, the radial stock removal distribution may be determined by film thinning so as to make the SOI film thickness be a target value using a thinning method used in a thinning step of the actual subsequent step (such as a batch processing type cleaning machine and a single wafer processing type cleaning machine), and by measuring the SOI film thickness after the film thinning, for example.

The rotational position of the SOI wafer in the thinning step is determined on the basis of the radial SOI film thickness distribution obtained in the measuring of the film thickness of the step (A1) and the previously determined radial stock removal distribution in the thinning step. As described above, the radial film thickness uniformity of the SOI layer after the thinning step is degraded when a portion with a thin film thickness of the SOI layer before the thinning step becomes a portion where the stock removal in the thinning step is large, for example. Accordingly, the rotational position may be determined so as to make the wafer to have small radial variance of difference between the film thickness of the SOI layer before the thinning step and the stock removal in the thinning step. More specifically, as the criterion for determining the rotational position, the following three criteria can be exemplified.

(Criterion 1)

The rotational position is determined to a position where an area showing the maximum value of the radial SOI film thickness distribution obtained in the measuring of the film thickness corresponds to an area showing the maximum value of the previously determined radial stock removal distribution in the thinning step.

(Criterion 2)

The rotational position is determined to a position where an area showing the minimum value of the radial SOI film thickness distribution obtained in the measuring of the film thickness corresponds to an area showing the minimum value of the previously determined radial stock removal distribution in the thinning step.

(Criterion 3)

The rotational position is determined by calculating the respective radial SOI film thickness distributions after the thinning step when altering the rotational position by a prescribed angle on the basis of the radial SOI film thickness distribution obtained by the measuring of the film thickness and the previously determined radial stock removal distribution in the thinning step, followed by fixing the rotational position to a position where a difference between the calculated radial maximum value and the calculated radial minimum value of the SOI film thickness after the thinning step is minimum.

It is possible to improve the radial SOI film thickness distribution or to minimize the degradation of the radial distribution due to the thinning step by performing the thinning step with the SOI wafer being rotated so as to be set to a rotation angle determined by any of the foregoing criteria. As a matter of course, the criteria for determining the rotational position is not limited thereto. The rotational position may be determined by any criterion to decrease the radial variance of the difference between the film thickness of the SOI layer before the thinning step and the stock removal in the thinning step on the wafer.

In this case, it is preferable to perform the step of measuring the SOI film thickness before the thinning step (step (A1)) and the subsequent step of rotating the SOI wafer (step (A2)) in the same apparatus since the process can be simplified. More specifically, when using an SOI film thickness measuring device equipped with a wafer rotary mechanism for an alignment in the step (A1), the rotational position of a wafer is determined at a time of collecting the wafer immediately after measuring the SOI film thickness on the basis of the measured radial SOI film thickness distribution and the previously determined radial stock removal distribution in the thinning step, the wafer is rotated with the wafer rotary mechanism in the SOI film thickness measuring device so as to bring the SOI wafer to the determined rotational position, and then the wafer is collected into a cleaning carrier of a cleaning machine used in the thinning step. This can perform the measuring of the SOI film thickness and the rotation of the wafer before the thinning step in the same apparatus, and can simplify the process.

[(A3) Thinning SOI Layer of Rotated SOI Wafer]

In the step (A3), the thinning is performed on the SOI layer of the SOI wafer rotated in the step (A2). As the method for thinning an SOI layer to adjust the SOI film thickness, it is effective to adopt thinning by cleaning (etching) with a batch processing type cleaning machine, but not limited thereto. According to a desired stock removal, it is possible to adopt various thinning methods such as cleaning (etching) with a single wafer processing type cleaning machine, a sacrificial oxidation process (batch processing, single wafer processing), gas etching with a gas (e.g., HCl), dry etching, wet etching, and flattening accompanied with thinning of the SOI layer by heat treatment in a reductive atmosphere such as hydrogen or argon.

It is preferable to perform the thinning step by immersing the SOI wafer in SC1 solution (mixed aqueous solution of $NH_4OH$ and $H_2O_2$).

In cleaning (etching) with a batch processing type cleaning machine and SC1 solution, the radial stock removal distribution of Si etching is liable to form deviation at the upper and lower portions in a water tank, and the etching stock removal at a portion immersed to an upper portion of the water tank tends to be smaller than the etching stock removal at a portion immersed to an lower portion in the water tank. This is because the chemical solution is heated in the circulation line and supplied from the lower portion in the water tank, the immersion time differs within the wafer surfaces and gets longer at the lower portion of the wafer since the wafer is put and taken out of the liquid surface, etc.

Accordingly, when the thinning step is performed by cleaning (etching) with a batch processing type cleaning machine and SC1 solution, it is possible to improve the radial SOI film thickness distribution after the thinning step with a batch processing type cleaning machine from that before the thinning step or to minimize degradation of the radial distribution after the thinning step by cleaning procedure described below: a rotational position is determined so as to bring the portion with a thin SOI film thickness to the upper side in a water tank of a batch processing type cleaning machine before the cleaning with the batch processing type cleaning machine, for example, on the basis of a radial SOI film thickness distribution obtained in the measuring of the SOI film thickness before the thinning step and the foregoing deviation of a radial stock removal distribution of etching; and the wafer is previously rotated before the batch processing type cleaning and introduced into a cleaning carrier.

If the radial stock removal distribution in a batch processing type cleaning machine is previously examined and put onto a database, the rotational position of each SOI wafer in a batch can be determined on the basis of the measured SOI film thickness before the thinning step, and the wafer can be rotated to each determined rotational position, and then introduced into the cleaning carrier and cleaned. Accordingly, it is possible to improve the radial distribution of each wafer with highly accuracy and to further simplify the process.

In a single wafer processing cleaning machine of a wafer immersion type, the radial stock removal distribution of Si etching is liable to form deviation at the upper and lower portions in a water tank as in the batch processing. Accordingly, it is possible to improve the radial SOI film thickness distribution after the thinning step with a single wafer processing type cleaning machine from that before the thinning step or to minimize degradation of the radial distribution after the thinning step by cleaning procedure described below: a rotational position is determined so as to bring the portion with a thin SOI film thickness to the upper side in a water tank of a single wafer processing type cleaning machine before the cleaning with the single wafer processing type cleaning machine on the basis of a radial SOI film thickness distribution obtained in the measuring of the SOI film thickness before the thinning step and the foregoing deviation of a radial stock removal distribution of etching; and the wafer is previously rotated before the single wafer processing type cleaning and introduced into a cleaning carrier.

On the other hand, in a single wafer processing cleaning machine of a chemical solution-poring type in which a wafer is held horizontally and chemical solution is poured from an upper pipe, the wafer is rotated continuously during the thinning step. Accordingly, the radial stock removal distribution in the thinning step becomes a concentric circle shape, and the radial film thickness distribution is not largely influenced by rotating the wafer before the thinning step around the central axis thereof to the determined rotational position. When the continuous rotation of the wafer is eccentric during the thinning step, the radial stock removal distribution differs from the concentric circle. Therefore, it is possible to improve the radial SOI film thickness distribution after the thinning step from that before the thinning step or to minimize degradation of the radial distribution after the thinning step by rotating a wafer before the thinning step to a desired rotational position.

Hereinafter, the inventive method for manufacturing an SOI wafer will be described more specifically with reference to FIG. 2, but the present invention is not limited thereto. FIG. 2 each shows an example of a radial SOI film thickness distribution in each stage and a previously determined radial stock removal distribution in the thinning step when an SOI wafer is actually manufactured by the flow of FIG. 1. FIG. 2 (a) shows the radial SOI film thickness distribution before the thinning step. FIG. 2 (b) shows the previously determined radial stock removal distribution in the thinning step. FIG. 2 (c) shows the radial SOI film thickness distribution after rotating the wafer. FIG. 2 (d) shows the radial SOI film thickness distribution after the thinning step.

First, an SOI layer is formed on a wafer. Then, SOI film thicknesses before the thinning step are measured to obtain a radial SOI film thickness distribution like FIG. 2 (a) as the step (A1). In FIG. 2 (a), for example, the average value of the SOI film thickness is 16.7 nm, and the radial film thickness distribution (film thickness Range: radial maximum value−radial minimum value of the film thickness) is 0.59 nm, which reveals that the SOI film is thinnest at the measuring position of 7:30 o'clock (the clockwise position of 225° when the upper end of the wafer is set to 0°).

Then, the rotational position of the wafer in the thinning step is determined as the step (A2). Prior to that, the radial stock removal distribution in the thinning step like FIG. 2 (b) is determined by previously measuring the radial stock removal distribution when the SOI film is thinned to a thickness of 12.0 nm with SC1 solution using a batch processing type cleaning machine. In FIG. 2 (b), for example, the average stock removal is 4.7 nm, and the radial stock removal distribution (stock removal Range: radial maximum value−radial minimum value of the stock removal) is 0.18 nm, which reveals that the stock removal is smallest at the upper side in a cleaning carrier.

Subsequently, the rotational position of the wafer in batch processing type cleaning is determined on the basis of the radial SOI film thickness distribution (FIG. 2 (a)) obtained in the step (A1) and the radial stock removal distribution (FIG. 2 (b)) in the thinning step obtained as described above. The rotational position can be determined to any value on the basis of the foregoing criteria, for example. In the batch processing type cleaning exemplified herein, the measuring position of 7:30 o'clock, at which the SOI film thickness is thinnest, is set to the upper side in the cleaning carrier, at which the stock removal is smallest. In this case, the wafer is rotated clockwise by 135° so as to bring the measuring position of 7:30 o'clock, at which the SOI film thickness is thinnest, to the upper side (at a position of 0 o'clock) in the cleaning carrier (FIG. 2 (c)). This rotation of the wafer may be performed in the SOI film thickness measuring device used in the step (A1) as described above, or may be performed separately after the wafer is pulled out from the SOI film thickness measuring device.

Then, the wafer rotated clockwise by 135° as in FIG. 2 (c) is transferred to the cleaning carrier and thinned to have an SOI film thickness of 12.0 nm with SC1 solution using a batch processing type cleaning machine as the step (A3).

Figure 2:
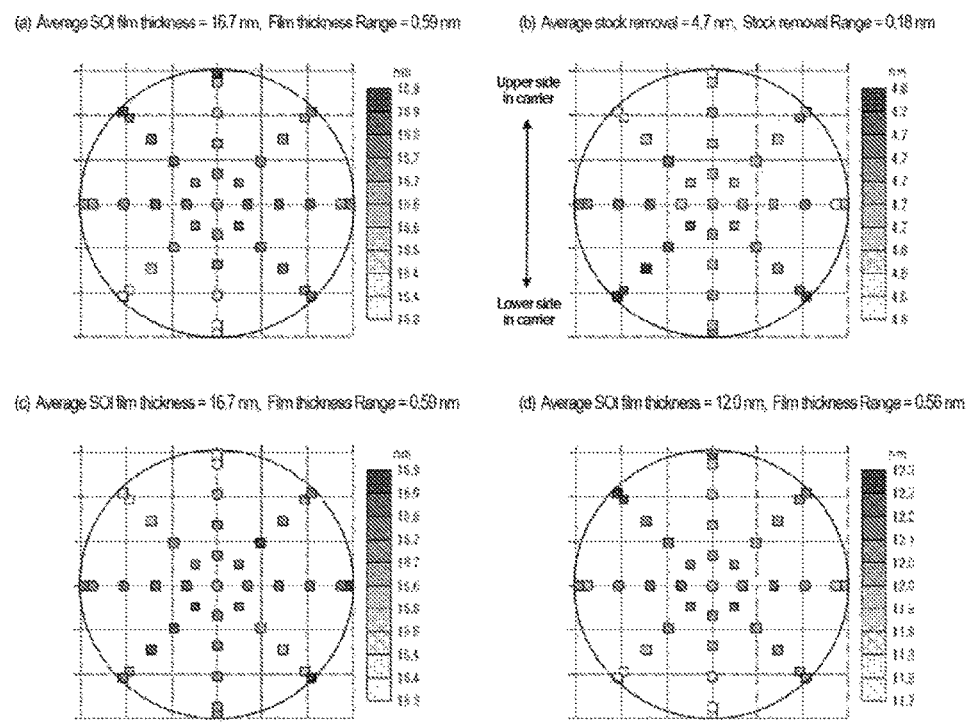
FIG. 2 are diagrams each showing an example of a radial SOI film thickness distribution in each stage and a previously determined radial stock removal distribution in the thinning step when an SOI wafer is manufactured by the flow of FIG. 1, in which (a) shows the radial SOI film thickness distribution before the thinning step, (b) shows the previously determined radial stock removal distribution in the thinning step, (c) shows the radial SOI film thickness distribution after rotating the wafer, and (d) shows the radial SOI film thickness distribution after the thinning step.

When the SOI film thickness distribution after the thinning step was measured, the average value of the SOI film thickness was 12.0 nm and the radial film thickness distribution (film thickness Range) was 0.56 nm as in FIG. 2 (d), which revealed that it is possible to improve the radial film thickness distribution from that before the thinning step, and to produce an SOI wafer with excellent radial film thickness uniformity after the thinning step by performing the thinning step as a flow of FIG. 1.

As described above, the inventive method for manufacturing an SOI wafer can produce an SOI wafer with an excellent radial film thickness uniformity of the SOI layer after the thinning step to adjust the SOI film thickness.

The present invention also provides a method for manufacturing an SOI wafer having an SOI layer including a thinning step to adjust an SOI film thickness of the SOI wafer, comprising the steps of:

(B0) heat treatment under an oxidizing gas atmosphere to form a thermal oxide film on a surface of the SOI layer;

(B1) measuring the SOI film thickness of the SOI wafer having the thermal oxide film formed in the step (B0) with the thermal oxide film remaining;

(B2) determining a rotational position of the SOI wafer in the thinning step on the basis of a radial SOI film thickness distribution obtained in the measuring of the film thickness of the step (B1) and a previously determined radial stock removal distribution in the thinning step, and rotating the SOI wafer around the central axis thereof so as to bring the SOI wafer to the determined rotational position; and (B3) thinning the SOI layer by batch processing cleaning which includes removing the thermal oxide film on the surface of the SOI layer and etching of the SOI layer of the SOI wafer rotated in the step (B2), with the etching amount of the SOI layer being controlled on the basis of the SOI film thickness obtained in the step (B1).

Figure 3:
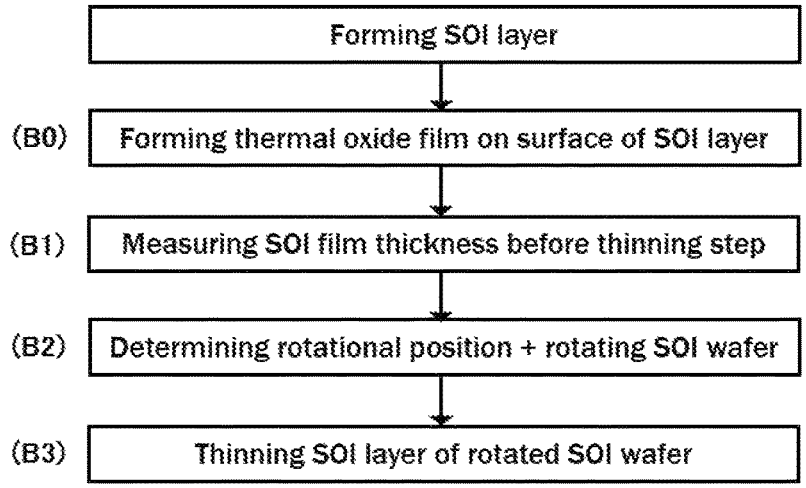
FIG. 3 is a flow diagram showing another example of the inventive method for manufacturing an SOI wafer.

An example of such a method for manufacturing an SOI wafer is described with reference to the flow diagram of FIG. 3. In the method for manufacturing an SOI wafer of FIG. 3, an SOI layer is formed on a wafer at first, and then a thermal oxide film is formed on the surface of the SOI layer by heat treatment under an oxidizing gas atmosphere (FIG. 3 (B0)). Subsequently, the SOI film thickness before the thinning step is measured with the thermal oxide film remaining (FIG. 3 (B1)). Then, a rotational position of the SOI wafer in the thinning step is determined on the basis of a radial SOI film thickness distribution obtained in the measuring of the film thickness of the step (B1) and a previously determined radial stock removal distribution in the thinning step, and the SOI wafer is rotated around the central axis thereof so as to bring the SOI wafer to the determined rotational position (FIG. 3 (B2)). Subsequently, the SOI layer is thinned by batch processing type cleaning which includes removing the thermal oxide film on the surface of the SOI layer and etching of the SOI layer of the SOI wafer rotated in the step (B2) while controlling the etching amount of the SOI layer on the basis of the SOI film thickness obtained in the step (B1) (FIG. 3 (B3)).

[(B0) Forming Thermal Oxide Film]

In the present invention, the formation of a thermal oxide film is not limited as far as it is performed by a method of heat treatment under an oxidizing gas atmosphere, and can be performed by a known method.

Incidentally, the formation of the SOI layer, the step (B1), and the step (B2) may be performed in a similar manner to the foregoing formation of the SOI layer, the step (A1), and the step (A2) respectively.

[(B3) Thinning SOI Layer of Rotated SOI Wafer]

In the step (B3), the SOI layer is thinned while controlling the etching amount of the SOI layer on the basis of the SOI film thickness (e.g., the radial average value) obtained in the step (B1) by batch processing type cleaning which includes removing the thermal oxide film on the surface of the SOI layer and etching of the SOI layer of the SOI wafer rotated in the step (B2). Although the specific thinning method by batch processing type cleaning which includes etching of the SOI layer is not particularly limited, it is preferable to apply the foregoing cleaning (etching) with SC1 solution using a batch processing type cleaning machine.

Such a method for manufacturing an SOI wafer can produce an SOI wafer with an excellent radial film thickness uniformity of the SOI layer after the thinning step by removing the thermal oxide film formed on the surface of the SOI layer before the thinning step, and then etching to adjust the film thickness.

The present invention also provides a method for manufacturing an SOI wafer having an SOI layer including a first thinning step and a second thinning step to adjust an SOI film thickness of the SOI wafer, comprising the steps of:

(C0) heat treatment under an oxidizing gas atmosphere to form a thermal oxide film on a surface of the SOI layer;

(C1) measuring the SOI film thickness of the SOI wafer having the thermal oxide film formed in the step (C0) with the thermal oxide film remaining;

(C2) determining a rotational position of the SOI wafer in the first thinning step on the basis of a radial SOI film thickness distribution obtained in the measuring of the film thickness of the step (C1) and a previously determined radial stock removal distribution in the first thinning step, and rotating the SOI wafer around the central axis thereof so as to bring the SOI wafer to the determined rotational position;

(C3) thinning the SOI layer to be thicker than a final target value of the film thickness as the first thinning step by batch processing cleaning which includes removing the thermal oxide film on the surface of the SOI layer and etching of the SOI layer of the SOI wafer rotated in the step (C2), with the etching amount of the SOI layer being controlled on the basis of the SOI film thickness obtained in the step (C1);

(C4) measuring the SOI film thickness of the SOI wafer after the first thinning step;

(C5) determining a rotational position of the SOI wafer in the second thinning step on the basis of a radial SOI film thickness distribution obtained in the measuring of the film thickness of the step (C4) and a previously determined radial stock removal distribution in the second thinning step, and rotating the SOI wafer around the central axis thereof so as to bring the SOI wafer to the determined rotational position; and (C6) thinning the SOI layer to be the final target value of the film thickness as the second thinning step by cleaning which includes etching of the SOI layer of the SOI wafer rotated in the step (C5), with the etching amount of the SOI layer being controlled on the basis of the SOI film thickness obtained in the step (C4).

Figure 4:
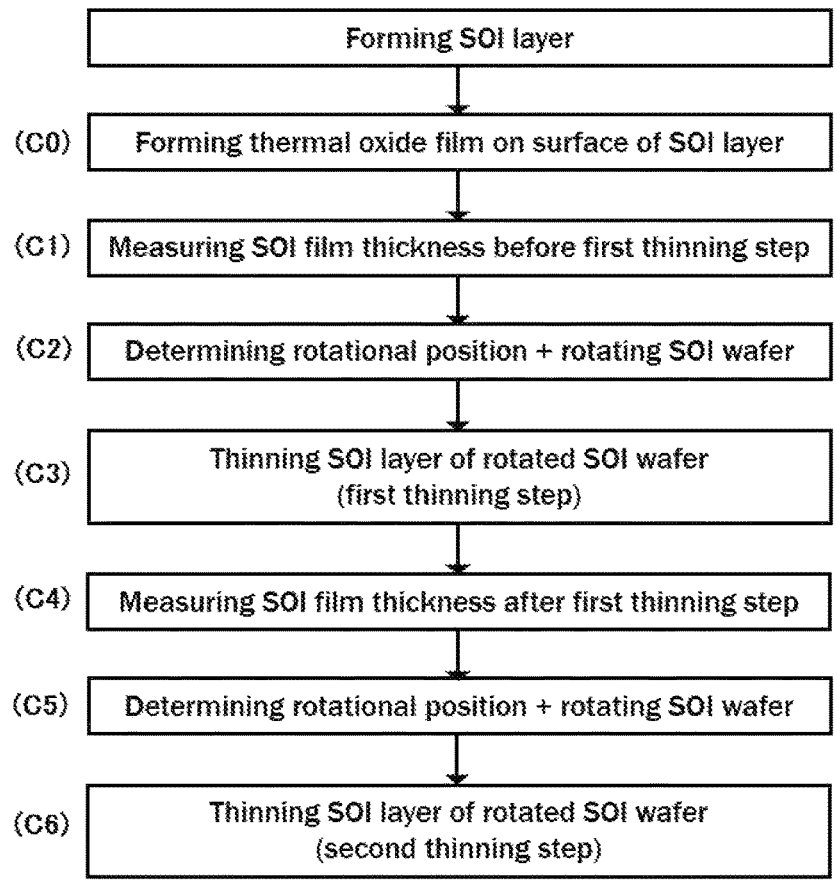
FIG. 4 is a flow diagram showing yet another example of the inventive method for manufacturing an SOI wafer.

An example of such a method for manufacturing an SOI wafer is described with reference to the flow diagram of FIG. 4. In the method for manufacturing an SOI wafer of FIG. 4, an SOI layer is formed on a wafer at first, and then a thermal oxide film is formed on the surface of the SOI layer by heat treatment under an oxidizing gas atmosphere (FIG. 4 (C0)). Subsequently, the SOI film thickness before the first thinning step is measured with the thermal oxide film remaining (FIG. 4 (C1)). Then, the rotational position of the SOI wafer in the first thinning step is determined on the basis of a radial SOI film thickness distribution obtained in the measuring of the film thickness of the step (C1) and a previously determined radial stock removal distribution in the first thinning step, and the SOI wafer is rotated around the central axis thereof so as to bring the SOI wafer to the determined rotational position (FIG. 4 (C2)). Subsequently, the SOI layer is thinned to be thicker than a final target value of the film thickness by batch processing type cleaning which includes removing the thermal oxide film on the surface of the SOI layer and etching of the SOI layer of the SOI wafer rotated in the step (C2) while controlling the etching amount of the SOI layer on the basis of the SOI film thickness obtained in the step (C1) (the first thinning step; FIG. 4 (C3)). Then, the SOI film thickness of the SOI wafer after the first thinning step is measured (FIG. 4 (C4)). Subsequently, the rotational position of the SOI wafer in the second thinning step is determined on the basis of a radial SOI film thickness distribution obtained in the measuring of the film thickness of the step (C4) and a previously determined radial stock removal distribution in the second thinning step, and the SOI wafer is rotated around the central axis thereof so as to bring the SOI wafer to the determined rotational position (FIG. 4 (C5)). Then, the SOI layer is thinned to be the final target value of the film thickness by cleaning which includes etching of the SOI layer of the SOI wafer rotated in the step (C5) while controlling the etching amount of the SOI layer on the basis of the SOI film thickness obtained in the step (C4) (the second thinning step; FIG. 4 (C6)).

Incidentally, the formation of the SOI layer, the step (C1), and the step (C2) may be performed in a similar manner to the foregoing formation of the SOI layer, the step (A1), and the step (A2) respectively. The step (C0) may be performed in a similar manner to the foregoing step (B0).

[(C3) Thinning SOI Layer of Rotated SOI Wafer (the First Thinning Step)]

In the step (C3), the SOI layer is thinned so as to be thicker than a final target value of the film thickness while controlling the etching amount of the SOI layer on the basis of the SOI film thickness (e.g., the radial average value) obtained in the step (C1) by batch processing type cleaning which includes removing the thermal oxide film on the surface of the SOI layer and etching of the SOI layer of the SOI wafer rotated in the step (C2). Although the step (C3) may be performed in a similar manner to the foregoing step (B3), the SOI layer is thinned so as to be thicker than the final target value in the first thinning step and is thinned so as to be the final target value in the second thinning step described later.

[(C4) Measuring SOI Film Thickness after the First Thinning Step]

In the step (C4), the SOI film thickness on the SOI wafer after the first thinning step is measured. The step (C4) may be performed in a similar manner to the foregoing step (A1).

[(C5) Determining Rotational Position of SOI Wafer and Rotating SOI Wafer]

In the step (C5), a rotational position of the SOI wafer in the second thinning step is determined on the basis of a radial SOI film thickness distribution obtained in the measuring of the film thickness of the step (C4) and a previously determined radial stock removal distribution in the second thinning step, and the SOI wafer is rotated around the central axis thereof so as to bring the SOI wafer to the determined rotational position. The step (C5) may be performed in a similar manner to the foregoing step (A2).

[(C6) Thinning SOI Layer of Rotated SOI Wafer (the Second Thinning Step)]

In the step (C6), the SOI layer is thinned so as to be the final target value of the film thickness while controlling the etching amount of the SOI layer on the basis of the SOI film thickness (e.g., the radial average value) obtained in the step (C4) by cleaning which includes etching of the SOI layer of the SOI wafer rotated in the step (C5). It is to be noted that the cleaning of the step (C6) may be performed in a similar manner to the foregoing step (A3), and is preferably performed by single wafer processing type cleaning.

Such a method for manufacturing an SOI wafer can produce an SOI wafer with an excellent radial film thickness uniformity of the SOI layer after the thinning step by a two-stage thinning process including the first thinning step to remove the thermal oxide film formed on the surface of the SOI layer before the thinning step, and the second thinning step to adjust the film thickness to the target value by etching.

It is to be noted that the inventive method for manufacturing an SOI wafer described above can be applied to various methods for manufacturing an SOI wafer such as Smart Cut method, SIMOX (Separation by IMplanted Oxygen) method, and rTCCP (room-Temperature Controlled Cleave Process) method. In these methods, it is also possible to improve the radial film thickness uniformity of an SOI layer after the thinning step by determining the rotational position in the thinning step before the thinning step, and by rotating the SOI wafer so as to bring the SOI wafer to the determined rotational position.

As described above, the inventive method for manufacturing an SOI wafer can produce an SOI wafer with an excellent radial film thickness uniformity of the SOI layer after the thinning step while controlling the film thickness of the SOI layer with high accuracy, for example, in a method for thinning an SOI layer by removing a thermal oxide film formed on the surface of the SOI layer and a method for thinning an SOI layer by a two-stage thinning process including removal of a thermal oxide film and adjustment of the film thickness. Accordingly, such methods are suitable for forming an FD-SOI wafer, which is required to have extremely high radial film thickness uniformity of the SOI layer. The inventive methods can improve the radial SOI film thickness distribution, and can improve the yield of producing an SOI wafer having a target SOI film thickness. As a result, it is possible to reduce the cost of the process.

Example

Hereinafter, the present invention will be specifically described with reference to Examples and Comparative Example, but the present invention is not limited thereto. Incidentally, in the Examples and Comparative Example described below, the thinning was performed by the first and the second thinning step with the final target value of the SOI layer being set to 12.0 nm.

Example 1

First, 50 pieces of SOI wafer (diameter of 300 mm) with an SOI film thickness of 150 nm produced by an ion implantation delamination method were prepared. These SOI wafers were subjected to heat treatment in the oxidation conditions shown in Table 1, and a thermal oxide film was formed on the surface of each SOI layer. Then, the film thickness of the SOI layer and the thermal oxide film of the SOI wafer having the thermal oxide film formed thereon were measured with an ellipsometer. The results are shown in Table 1.

Then, on the basis of the radial SOI film thickness distribution obtained in the measuring of the film thickness and the previously determined radial stock removal distribution in the first thinning step, the wafer was rotated clockwise by 135° and then transferred to a cleaning carrier with a transfer machine (out of the SOI film thickness measuring device) after measuring the SOI film thickness so as to bring the area with thinnest radial film thickness of the SOI layer to the upper side in a cleaning tank (i.e., the area where the stock removal is smallest) to perform the first thinning step.

Subsequently, the wafers were subjected to batch processing type cleaning (cleaning for removing the oxide film) as the first thinning step so as to have an SOI film thickness of 13.0 nm (thicker than the final target value) in the cleaning conditions shown in Table 1 with a batch processing type cleaning machine in which plural wafers are integrated into a cassette as one batch. Incidentally, the cleaning was performed by combination of cleaning with 15% HF solution (100 sec) and cleaning with SC1 solution (aqueous $NH_4OH$ solution (29%):aqueous $H_2O_2$ solution (30%): $H_2O$=1:1:5; the liquid temperature of 76° C.) (240 sec).

After that, the SOI film thickness after the first thinning step is measured. The results are shown in Table 1.

Then, on the basis of the radial SOI film thickness distribution obtained in the measuring of the SOI film thickness after the first thinning step and the previously determined radial stock removal distribution in the second thinning step, each wafer was rotated and then transferred to a cleaning carrier with a transfer machine (out of the SOI film thickness measuring device) after measuring the SOI film thickness so as to bring the area with thinnest radial film thickness of the SOI layer to the upper side in a cleaning tank (i.e., the area where the stock removal is smallest) to perform the second thinning step.

Subsequently, the wafer was subjected to batch processing type cleaning (cleaning for adjusting the film thickness) in the cleaning conditions shown in Table 1 with SC1 solution using a batch processing type cleaning machine as the second thinning step. In the batch processing type cleaning for adjusting the film thickness, the cleaning carriers were divided to house the SOI wafers in which the radial average value of the SOI film thickness differ from each other by every 0.1 nm on the basis of the measured results of the SOI film thickness after the first thinning step, and the SOI wafer was thinned to the target value (12.0 nm) with the immersion time to SC1 in the cleaning for adjusting the film thickness being altered in each carrier. Incidentally, the SC1 was the same one used in the first thinning step.

After that, the SOI film thickness after the second thinning step was measured. Furthermore, the ratio of wafers (yield) which came to have an SOI layer of 12.0 nm±0.5 nm was calculated on the basis of the measured radial SOI film thickness distribution after the second thinning step. The results are shown in Table 1.

Example 2

Each SOI layer was thinned by the same procedure with Example 1 except for performing the rotation of the SOI wafer before the first thinning step and the rotation of the SOI wafer before the second thinning step by using a wafer rotary mechanism in the SOI film thickness measuring device without providing the step of rotating the wafer separately. Incidentally, in the rotations of the SOI wafer before the first thinning step and the second thinning step, each wafer was rotated so as to bring the area with thinnest radial film thickness of the SOI layer to the upper side in a cleaning tank (i.e., the area where the stock removal is smallest) to perform the thinning step as in Example 1.

The experimental conditions, the measured results of the SOI film thickness in each stage, and the calculated yields are shown in Table 1.

Example 3

Each SOI layer was thinned by the same procedure with Example 1 except for performing the rotation of the SOI wafer before the first thinning step and the rotation of the SOI wafer before the second thinning step by using a wafer rotary mechanism in the SOI film thickness measuring device without providing the step of rotating the wafer separately, and performing the second thinning step by single wafer processing cleaning of a wafer immersion type. Incidentally, in the rotations of the SOI wafer before the first thinning step and the second thinning step, each wafer was rotated so as to bring the area with thinnest radial film thickness of the SOI layer to the upper side in a cleaning tank (i.e., the area where the stock removal is smallest) to perform the thinning step as in Example 1.

In the single wafer processing cleaning of a wafer immersion type, the SOI wafer was thinned to the target value (12.0 nm) with the immersion time to SC1 being altered for each wafer in accordance with the SOI film thickness on the basis of the measured results of the SOI film thickness after the first thinning step. Incidentally, the SC1 was the same one used in the first thinning step.

The experimental conditions, the measured results of the SOI film thickness in each stage, and the calculated yields are shown in Table 1.

Comparative Example 1

Each SOI layer was thinned by the same procedure with Example 1 except that the rotation of the SOI wafer before the first thinning step and the rotation of the SOI wafer before the second thinning step were not performed. The experimental conditions, the measured results of the SOI film thickness in each stage, and the calculated yields are shown in Table 1.

TABLE 1

| | Example 1 | Example 2 | Example 3 | Comparative Example 1 |
|---|---|---|---|---|
| SOI film thickness (FT) before oxidation step (number of pieces) | SOI FT = 150 nm (50 pieces) | SOI FT = 150 nm (50 pieces) | SOI FT = 150 nm (50 pieces) | SOI FT = 150 nm (50 pieces) |
| Oxidation step | (Oxidizing conditions) 950° C., 2 hr, pyrogenic atmosphere | | | |
| Oxide FT/SOI FT measured before first thinning step (ellipsometer) | Oxide FT = 300 nm SOI FT = 16.5 nm FT Range = 0.70 nm Wafer was not rotated at collection | Oxide FT = 300 nm SOI FT = 16.5 nm FT Range = 0.70 nm Wafer was rotated at collection | Oxide FT = 300 nm SOI FT = 16.5 nm FT Range = 0.70 nm Wafer was rotated at collection | Oxide FT = 300 nm SOI FT = 16.5 nm FT Range = 0.70 nm Wafer was not rotated at collection |
| Wafer rotation step before first thinning step (separated) | Performed | Not performed | Not performed | Not performed |
| Cleaning for removing oxide film (first thinning step) | Batch processing 15% HF: 100 sec SC1: 240 sec | Batch processing 15% HF: 100 sec SC1: 240 sec | Batch processing 15% HF: 100 sec SC1: 240 sec | Batch processing 15% HF: 100 sec SC1: 240 sec |
| SOI FT measured after first thinning step (ellipsometer) | SOI FT = 13.0 nm FT Range = 0.64 nm Wafer was not rotated at collection | SOI FT = 13.0 nm FT Range = 0.64 nm Wafer was rotated at collection | SOI FT = 13.0 nm FT Range = 0.64 nm Wafer was rotated at collection | SOI FT = 13.0 nm FT Range = 0.75 nm Wafer was not rotated at collection |
| Wafer rotation step before second thinning step (separated) | Performed | Not performed | Not performed | Not performed |
| Wafer division in cassette | Divided | Divided | Not divided | Divided |
| Cleaning for adjusting FT (second thinning step) | Batch processing SC1: 20 to 60 sec | Batch processing SC1: 20 to 60 sec | Single wafer processing of wafer immersion type SC1: 20 to 60 sec | Batch processing SC1: 20 to 60 sec |
| SOI FT measured after second thinning step | SOI FT = 12.0 nm FT Range = 0.61 nm | SOI FT = 12.0 nm FT Range = 0.61 nm | SOI FT = 12.0 nm FT Range = 0.61 nm | SOI FT = 12.0 nm FT Range = 0.79 nm |
| Yield of 12.0 nm ± 0.5 nm | 98% | 98% | 98% | 80% |

As shown in Table 1, on comparison of the SOI film thickness after the first thinning step (cleaning for removing the oxide film), each of Examples 1 to 3, in which the wafer was rotated before the first thinning step, showed a film thickness Range after the first thinning step of 0.64 nm. Accordingly, the film thickness Range of the SOI layer were improved compared to Comparative Example 1 (the film thickness Range=0.75 nm), in which the wafer was not rotated.

On comparison of the SOI film thickness after the second thinning step (cleaning for adjusting the film thickness), each of Examples 1 to 3, in which the wafer was rotated before the second thinning step, showed a film thickness Range after the second thinning step of 0.61 nm. Accordingly, the film thickness Range of the SOI layer were improved compared to Comparative Example 1 (the film thickness Range=0.79 nm), in which the wafer was not rotated.

As the result of the improved film thickness Range, the yields of products to meet the standard of SOI film thickness (12.0 nm±0.5 nm) were improved.

It is to be noted that the film thickness Range and the yields did not show differences between the case of rotating the wafer in the SOI film thickness measuring device at the time of collecting the wafer for measuring the SOI film thickness (Example 2) and the case of rotating the wafer separately after measuring the SOI film thickness (Example 1).

On account of the foregoing results, it was revealed that the inventive method for manufacturing an SOI wafer can produce an SOI wafer with an excellent radial film thickness uniformity of the SOI layer after the thinning step to adjust the SOI film thickness.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A method for manufacturing an SOI wafer having an SOI layer including a thinning step to adjust an SOI film thickness of the SOI wafer, comprising the steps of:
   (A1) measuring the S01 film thickness of the SOI wafer having the SOT layer before the thinning step;
   (A2) determining a rotational position of the SOI wafer by rotating the SOI wafer before the thinning step on the basis of a radial SOI film thickness distribution obtained in the measuring of the film thickness of the step (A1) and a previously determined radial stock removal distribution in the thinning step, and rotating the SOI wafer around the central axis thereof so as to bring the SOI wafer to the determined rotational position; and
   (A3) thinning the SOI layer of the SOI wafer after being rotated in the step (A2), wherein the wafer is not rotated during the thinning step.

2. The method for manufacturing an SOI wafer according to claim 1, wherein the rotational position is determined to a position where an area showing the maximum value of the radial SOI film thickness distribution obtained in the measuring of the film thickness corresponds to an area showing the maximum value of the previously determined radial stock removal distribution in the thinning step.

3. The method for manufacturing an SOI wafer according to claim 1, wherein the rotational position is determined to a position where an area showing the minimum value of the radial SOI film thickness distribution obtained in the measuring of the film thickness corresponds to an area showing the minimum value of the previously determined radial stock removal distribution in the thinning step.

4. The method for manufacturing an SOI wafer according to claim 1, wherein the rotational position is determined to a position where a difference between a calculated radial maximum value and a calculated radial minimum value of the SOI film thickness after the thinning step is minimum in calculation of the respective radial SOI film thickness distributions after the thinning step when altering the rotational position by a prescribed angle on the basis of the radial SOI film thickness distribution obtained by the measuring of the film thickness and the previously determined radial stock removal distribution in the thinning step.

5. The method for manufacturing an SOI wafer according to claim 1, wherein the step of measuring the SOI film thickness before the thinning step and the subsequent step of rotating the SOI wafer are performed in the same apparatus.

6. The method for manufacturing an SOI wafer according to claim 1, wherein the SOI layer is formed by an ion implantation delamination method including at least the steps of:
   bonding a bond wafer having a micro bubble layer formed by an ion implantation with a base wafer to be a support substrate, and
   delaminating the bond wafer along the micro bubble layer as a boundary to form a thin film on the base wafer.

7. The method for manufacturing an SOI wafer according to claim 1, wherein the thinning step is performed by immersion in SC1 solution.

8. A method for manufacturing an SOI wafer having an SOI layer including a thinning step to adjust an SOI film thickness of the SOI wafer, comprising the steps of:
   (BO) heat treatment under an oxidizing gas atmosphere to form a thermal oxide film on a surface of the SOI layer;
   (B 1) measuring the SOI film thickness of the SOI wafer having the thermal oxide film formed in the step (BO) with the thermal oxide film remaining;
   (B2) determining a rotational position of the SOI wafer by rotating the SOI wafer before the thinning step on the basis of a radial SOI film thickness distribution obtained in the measuring of the film thickness of the step (B 1) and a previously determined radial stock removal distribution in the thinning step, and rotating the SOI wafer around the central axis thereof so as to bring the SOI wafer to the determined rotational position; and
   (B3) thinning the SOI layer by batch processing cleaning which includes removing the thermal oxide film on the surface of the SOI layer and etching of the SOI layer of the SOI wafer after being rotated in the step (B2), with the etching amount of the SOI layer being controlled on the basis of the SOI film thickness obtained in the step (B 1), wherein the wafer is not rotated during the thinning step.

9. The method for manufacturing an SOI wafer according to claim 8, wherein the rotational position is determined to a position where an area showing the maximum value of the radial SOI film thickness distribution obtained in the measuring of the film thickness corresponds to an area showing the maximum value of the previously determined radial stock removal distribution in the thinning step.

10. The method for manufacturing an SOI wafer according to claim 8, wherein the rotational position is determined to a position where an area showing the minimum value of the radial SOI film thickness distribution obtained in the measuring of the film thickness corresponds to an area showing the minimum value of the previously determined radial stock removal distribution in the thinning step.

11. The method for manufacturing an SOI wafer according to claim 8, wherein the rotational position is determined to a position where a difference between a calculated radial maximum value and a calculated radial minimum value of the SOI film thickness after the thinning step is minimum in calculation of the respective radial SOI film thickness distributions after the thinning step when altering the rotational position by a prescribed angle on the basis of the radial SOI film thickness distribution obtained by the measuring of the film thickness and the previously determined radial stock removal distribution in the thinning step.

12. The method for manufacturing an SOI wafer according to claim 8, wherein the step of measuring the SOI film thickness before the thinning step and the subsequent step of rotating the SOI wafer are performed in the same apparatus.

13. The method for manufacturing an SOI wafer according to claim 8, wherein the SOI layer is formed by an ion implantation delamination method including at least the steps of:
   bonding a bond wafer having a micro bubble layer formed by an ion implantation with a base wafer to be a support substrate, and delaminating the bond wafer along the micro bubble layer as a boundary to form a thin film on the base wafer.

14. The method for manufacturing an SOI wafer according to claim 8, wherein the thinning step is performed by immersion in SC1 solution.

15. A method for manufacturing an SOI wafer having an SOI layer including a first thinning step and a second thinning step to adjust an SOI film thickness of the SOI wafer, comprising the steps of:
- (CO) heat treatment under an oxidizing gas atmosphere to form a thermal oxide film on a surface of the SOI layer;
- (C1) measuring the SOI film thickness of the SOI wafer having the thermal oxide film formed in the step (CO) with the thermal oxide film remaining;
- (C2) determining a rotational position of the SOI wafer by rotating the SOI wafer before the first thinning step on the basis of a radial SOI film thickness distribution obtained in the measuring of the film thickness of the step (C1) and a previously determined radial stock removal distribution in the first thinning step, and rotating the SOI wafer around the central axis thereof so as to bring the SOI wafer to the determined rotational position;
- (C3) thinning the SOI layer to be thicker than a final target value of the film thickness as the first thinning step by batch processing cleaning which includes removing the thermal oxide film on the surface of the SOI layer and etching of the SOI layer of the SOI wafer after being rotated in the step (C2), with the etching amount of the SOI layer being controlled on the basis of the SOI film thickness obtained in the step (C1), wherein the wafer is not rotated during the first thinning step;
- (C4) measuring the SOI film thickness of the SOI wafer after the first thinning step;
- (C5) determining a rotational position of the SOI wafer in the second thinning step on the basis of a radial SOI film thickness distribution obtained in the measuring of the film thickness of the step (C4) and a previously determined radial stock removal distribution in the second thinning step, and rotating the SOI wafer around the central axis thereof so as to bring the SOI wafer to the determined rotational position; and
- (C6) thinning the SOI layer to be the final target value of the film thickness as the second thinning step by cleaning which includes etching of the SOI layer of the SOI wafer after being rotated in the step (C5), with the etching amount of the SOI layer being controlled on the basis of the SOI film thickness obtained in the step (C4), wherein the wafer is not rotated during the second thinning step.

16. The method for manufacturing an SOI wafer according to claim 15, wherein the cleaning of the step (C6) is performed by single wafer processing.

17. The method for manufacturing an SOI wafer according to claim 15, wherein the rotational position is determined to a position where an area showing the maximum value of the radial SOI film thickness distribution obtained in the measuring of the film thickness corresponds to an area showing the maximum value of the previously determined radial stock removal distribution in the thinning step.

18. The method for manufacturing an SOI wafer according to claim 15, wherein the rotational position is determined to a position where an area showing the minimum value of the radial SOI film thickness distribution obtained in the measuring of the film thickness corresponds to an area showing the minimum value of the previously determined radial stock removal distribution in the thinning step.

19. The method for manufacturing an SOI wafer according to claim 15, wherein the rotational position is determined to a position where a difference between a calculated radial maximum value and a calculated radial minimum value of the SOI film thickness after the thinning step is minimum in calculation of the respective radial SOI film thickness distributions after the thinning step when altering the rotational position by a prescribed angle on the basis of the radial SOI film thickness distribution obtained by the measuring of the film thickness and the previously determined radial stock removal distribution in the thinning step.

20. The method for manufacturing an SOI wafer according to claim 15, wherein the step of measuring the SOI film thickness before the thinning step and the subsequent step of rotating the SOI wafer are performed in the same apparatus.

21. The method for manufacturing an SOI wafer according to claim 15, wherein the SOI layer is formed by an ion implantation delamination method including at least the steps of:
- bonding a bond wafer having a micro bubble layer formed by an ion implantation with a base wafer to be a support substrate, and
- delaminating the bond wafer along the micro bubble layer as a boundary to form a thin film on the base wafer.

22. The method for manufacturing an SOI wafer according to claim 15, wherein the thinning step is performed by immersion in SC1 solution.

* * * * *